US009697815B2

(12) United States Patent
Ishizu

(10) Patent No.: US 9,697,815 B2
(45) Date of Patent: Jul. 4, 2017

(54) EFFECT CIRCUIT

(71) Applicant: Onkyo Corporation, Osaka (JP)

(72) Inventor: Naoto Ishizu, Osaka (JP)

(73) Assignee: Onkyo Corporation, Neyagawa-shi (JP)

( * ) Notice: Subject to any disclaimer, the term of this patent is extended or adjusted under 35 U.S.C. 154(b) by 75 days.

(21) Appl. No.: 14/851,503

(22) Filed: Sep. 11, 2015

(65) Prior Publication Data

US 2016/0111071 A1 Apr. 21, 2016

(30) Foreign Application Priority Data

Oct. 20, 2014 (JP) ................................ 2014-213962

(51) Int. Cl.
*H03G 3/00* (2006.01)
*G10H 1/16* (2006.01)
*G10H 3/18* (2006.01)

(52) U.S. Cl.
CPC ............... *G10H 1/16* (2013.01); *G10H 3/187* (2013.01); *G10H 2210/311* (2013.01)

(58) Field of Classification Search
CPC .... G10H 1/16; G10H 2210/311; G10H 3/187; G10H 1/0091; H03G 7/004; H03G 7/00; H03G 7/08; H03G 5/025
USPC ........... 381/61, 118, 120, 94.8; 330/75, 110, 330/250, 260
See application file for complete search history.

(56) References Cited

U.S. PATENT DOCUMENTS 4,899,115 A * 2/1990 Christian ................. H03G 7/08 330/302
5,032,796 A * 7/1991 Tiers ........................ G10H 1/16 330/110
2005/0201573 A1* 9/2005 Poletti ...................... G10H 1/12 381/118
2009/0080677 A1* 3/2009 Webster ................. G10H 3/187 381/118

FOREIGN PATENT DOCUMENTS

WO WO 03/077232 A1 9/2003

* cited by examiner

*Primary Examiner* — Vivian Chin
*Assistant Examiner* — Friedrich W Fahnert
(74) *Attorney, Agent, or Firm* — Renner, Otto, Boisselle & Sklar, LLP

(57) ABSTRACT

To provide an effect circuit that can give round-shaped distortion effect to a music signal.
An effect circuit 1 includes a input resistor R2 that is connected to a negative input terminal of an operational amplifier U1, a feedback resistor VR1 that is provided between a positive input terminal of the operational amplifier U1 and an output terminal of the operational amplifier U1, zener diodes D1 and D2 in each of which cathodes are connected and that are provided in parallel with the feedback resistor VR1, and diodes D3 and D4 that are connected in parallel so that each cathode and each anode are connected and are provided between cathodes of the zener diodes D1 and D2.

7 Claims, 11 Drawing Sheets

EFFECT CIRCUIT

BACKGROUND OF THE INVENTION

1. Field of the Invention

The present invention relates to an effect circuit that gives effect such as distortion to a music signal that is input from an electric musical instrument such as an electric guitar or an electric bass, an electronic musical instrument such as a keyboard, or a toy.

2. Description of the Related Art

In playing an electric musical instrument such as an electric guitar or an electric bass, an electronic musical instrument such as a keyboard, or a toy, an effect circuit that gives effect such as distortion to a music signal that is input from the electric musical instrument, the electronic musical instrument, or the like is used. As the effect circuit, a distortion circuit that gives distortion effect to the music signal by clipping the music signal symmetrically, an over drive circuit that gives the distortion effect to the music signal by clipping the music signal asymmetrically and so on are known (For example, see international publication No. WO2003/077232).

FIG. 9 is a diagram illustrating a circuit configuration of a conventional effect circuit that gives the distortion effect to the music signal by clipping the music signal symmetrically. As illustrating in FIG. 9, an effect circuit 100 includes an operational amplifier U1, zener diodes D1 and D2, resistors R1 to R3, condensers C1 to C4, and a variable resistor VR1. The operational amplifier U1 amplifies the music signal that is input from the electric musical instrument. The music signal is input to a positive input terminal of the operational amplifier U1. Bias voltage Vcc/2 is given to the positive input terminal of the operational amplifier U1 via the resistor R1. The music signal that is output from an output terminal is returned to a negative input terminal of the operational amplifier U1. The variable resistor VR1 is a feedback resistor that is provided between the negative input terminal of the operational amplifier U1 and the output terminal of the operational amplifier U1, namely, in feedback part of the operational amplifier U1. The resistor R2 is an input resistor that is connected to the negative input terminal of the operational amplifier U1. Amplification factor of the operational amplifier U1 is decided by the resistor R2 and the variable resistor VR1. Namely, the operational amplifier U1 amplifies the music signal with the amplification factor that is decided by the resistor R2 and the variable resistor VR1. For example, a user can change a resistance value of the variable resistor VR1 by operating an operation knob, not shown, that is provided at an enclosure of the effect circuit 100.

The zener diodes D1 and D2 clip the music signal so as to give the distortion effect to the music signal. Each of cathodes of the zener diodes D1 and D2 is connected, and the zener diodes D1 and D2 are provided in parallel with the variable resistor VR1. Namely, the zener diodes D1 and D2 are provided in the feedback part of the operational amplifier U1.

The resistor R3 is provided in parallel with the output terminal of the operational amplifier U1 and is earthed at one end. The condensers C1 to C4 are provided at positions that are illustrated.

In the effect circuit 100, a positive side music signal is clipped by zener voltage of the zener diode D1. A negative side music signal is clipped by zener voltage of the zener diode D2. FIG. 10 is a graph illustrating the music signal that the conventional effect circuit 100 outputs. A vertical axis illustrates voltage [v] and a horizontal axis illustrates time [ms].

FIG. 11 is a diagram illustrating a circuit configuration of another conventional effect circuit. The other conventional circuit 100 illustrated in FIG. 11 is compared with the conventional circuit 100 illustrated in FIG. 9 and a configuration that the zener diodes D1 and D2 are provided in parallel with the output terminal of the operational amplifier U1 is mainly different. Further, a resister R4 and a condenser C5 are added to the other conventional effect circuit 100 illustrated in FIG. 11 compared to the conventional effect circuit 100 illustrated in FIG. 9. In the effect circuit 100 illustrated in FIG. 11, the positive side music signal that is output from the operational amplifier U1 is clipped by the zener voltage of the zener diode D1. The negative side music signal that is output from the operational amplifier U1 is clipped by the zener voltage of the zener diode D2.

A zener diode has characteristics that current flows suddenly when voltage of opposite direction becomes bigger than the zener voltage. Thus, when the music signal is clipped by the zener diode, as illustrating in FIG. 10, waveform is clipped steeply and an odd-harmonic component is emphasized. Therefore, the music signal that is output from the conventional effect circuit is rough sound as the distortion.

SUMMARY OF THE INVENTION

It is an object of the present invention to provide an effect circuit that can give round-shaped distortion effect to a music signal.

An effect circuit comprising: an operational amplifier in which a music signal is input to one input terminal while the music signal that is output from an output terminal is returned to the other input terminal; an input resistor that is connected to the other input terminal; a feedback resistor that is provided between the other input terminal and the output terminal; zener diodes in each of which cathodes are connected and that are provided in parallel with the feedback resistor; and diodes that are connected in parallel so that each cathode and each anode are connected and are provided between cathodes of the zener diodes.

An effect circuit comprising: an operational amplifier in which a music signal is input to one input terminal while the music signal that is output from an output terminal is returned to the other input terminal; an input resistor that is connected to the other input terminal; a feedback resistor that is provided between the other input terminal and the output terminal; zener diodes in each of which cathodes are connected and that are provided in parallel with the output terminal; and diodes that are connected in parallel so that each cathode and each anode are connected and are provided between cathodes of the zener diodes.

In the present invention, diodes are connected in parallel so that each cathode and each anode are connected and are provided between cathodes of zener diodes. Therefore, voltage to clip the music signal becomes voltage adding zener voltage of the zener diode and forward voltage of the diode. Namely, since the voltage to clip the music signal is risen by the forward voltage of the diode, a steep edge of clip waveform by the zener diode becomes round, abrasive sound is relieved, and an odd-harmonic component is reduced. Thus, the music signal becomes a music signal to which round-shaped distortion effect is given. Therefore, according to the present invention, round-shaped distortion effect can be given to the music signal.

Further, in the present invention, amplitude of the music signal that is output from an effect circuit becomes big compared with a conventional effect circuit since the voltage for clipping the music signal is risen by diodes. Therefore, according to the present invention, the music signal that has big amplitude and to which the distortion effect is given can be obtained in a simple circuit configuration that only the diodes are added to the conventional effect circuit.

Preferably, wherein the diodes include two or more diodes in each of which anode and cathode are connected in series and the number of the diodes that are in parallel is different.

In the present invention, the diodes include two or more diodes in each of which anode and cathode are connected in series and the number of the diodes that are in parallel is different. For example, two diodes in each of which anode and cathode are connected in series and one diode are connected in parallel. Thus, positive side music signal and negative side music signal are clipped asymmetrically. Therefore, in the present invention, the effect circuit can be an over drive circuit that gives the distortion effect to the music signal by clipping the music signal asymmetrically.

Preferably, wherein the number of the diodes that are in parallel is the same.

In the present invention, the number of the diodes that are in parallel is the same. Thus, the positive side music signal and the negative side music signal are clipped symmetrically. Therefore, in the present invention, the effect circuit can be a distortion circuit that gives the distortion effect by clipping the music signal symmetrically.

Preferably, wherein the input resistor is a variable resistor.

In the present invention, since an input resistor is a variable resistor, amplification factor by an operational amplifier can be variable.

Preferably, wherein the feedback resistor is a variable resistor.

In the present invention, since a feedback resistor is a variable resistor, the amplification factor by the operational amplifier can be variable.

According to the present invention, the round-shaped distortion effect can be given to the music signal.

DETAILED DESCRIPTION OF THE PREFERRED EMBODIMENTS

Hereinafter, an embodiment of the present invention will be described.

First Embodiment

Figure 1:
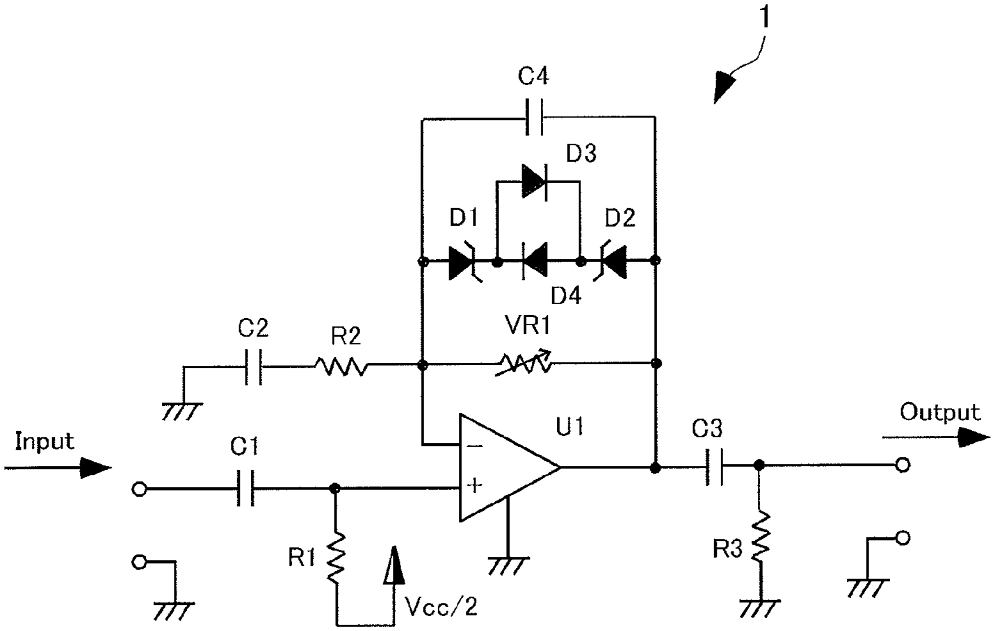
FIG. 1 is a diagram illustrating a circuit configuration of an effect circuit according to a first embodiment of the present invention.
Figure 9:
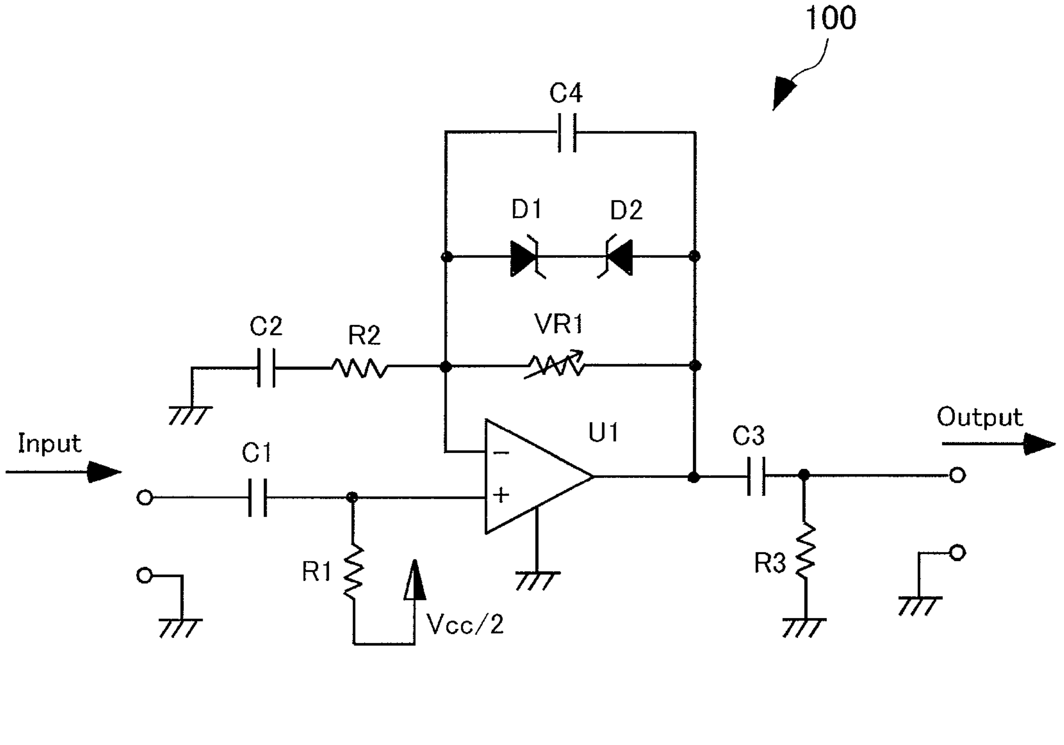
FIG. 9 is a diagram illustrating a circuit configuration of a conventional effect circuit.
Figure 10:
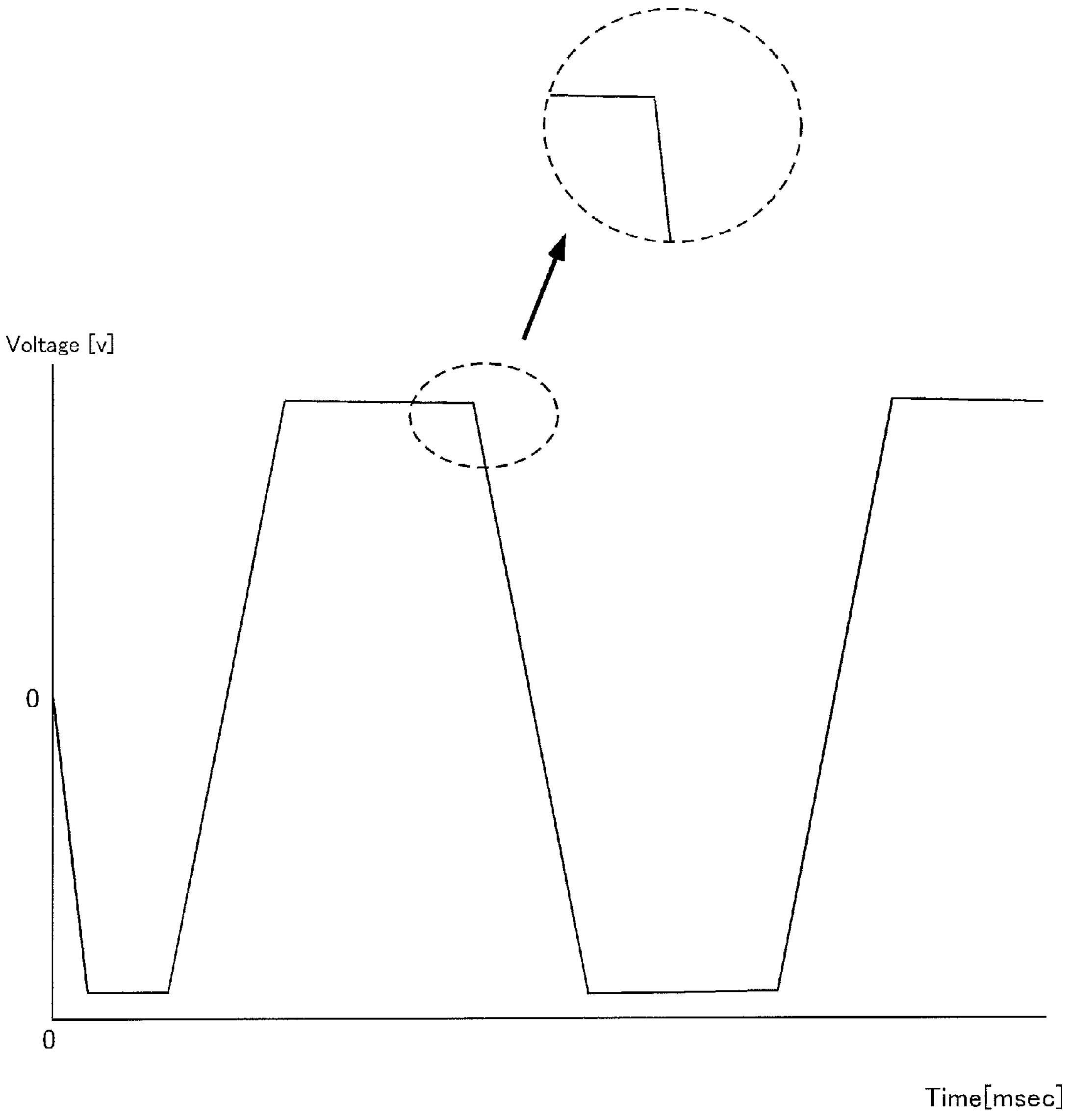
FIG. 10 is a graph illustrating a music signal that the conventional effect circuit outputs.

FIG. 1 is a diagram illustrating a circuit configuration of an effect circuit according to a first embodiment of the present invention. An effect circuit 1 according to the first embodiment is compared with a conventional circuit 100 illustrated in FIG. 9, and a configuration to which diodes D3 and D4 are added is different.

The effect circuit 1 includes an operational amplifier U1, zener diodes D1 and D2, the diodes D3 and D4, resistors R1 to R3, condensers C1 to C4, and a variable resistor VR1. The operational amplifier U1 amplifies a music signal that is input from an electric musical instrument. The music signal is input to a positive input terminal (one of input terminals) of the operational amplifier U1. Bias voltage Vcc/2 is given to the positive input terminal of the operational amplifier U1 via the resistor R1. The music signal that is output from an output terminal is returned to a negative input terminal (the other of the input terminals) of the operational amplifier U1. The variable resistor VR1 is a feedback resistor that is provided between the negative input terminal of the operational amplifier U1 and the output terminal of the operational amplifier U1, namely, in feedback part of the operational amplifier U1. The resistor R2 is an input resistor that is connected to the negative input terminal of the operational amplifier U1. Amplification factor of the operational amplifier U1 is decided by the resistor R2 and the variable resistor VR1. Namely, the operational amplifier U1 amplifies the music signal with the amplification factor that is decided by the resistor R2 and the variable resistor VR1. For example, a user can change a resistance value of the variable resistor VR1 by operating an operation knob, not shown, that is provided at an enclosure of the effect circuit 1.

Each of cathodes of the zener diodes D1 and D2 are connected, and the zener diodes D1 and D2 are provided in parallel with the variable resistor VR1. Namely, the zener diodes D1 and D2 are provided in the feedback part of the operational amplifier U1.

The resistor R3 is provided in parallel with the output terminal of the operational amplifier U1 and is earthed at one end. The condensers C1 to C4 are provided at positions that are illustrated.

The diodes D3 and D4 are connected in parallel so that each cathode and anode of the diodes D3 and D4 are connected. The diodes D3 and D4 are provided between the cathodes of the zener diodes D1 and D2. In the present embodiment, each of the zener diodes D3 and D4 is a silicon diode.

Figure 2:
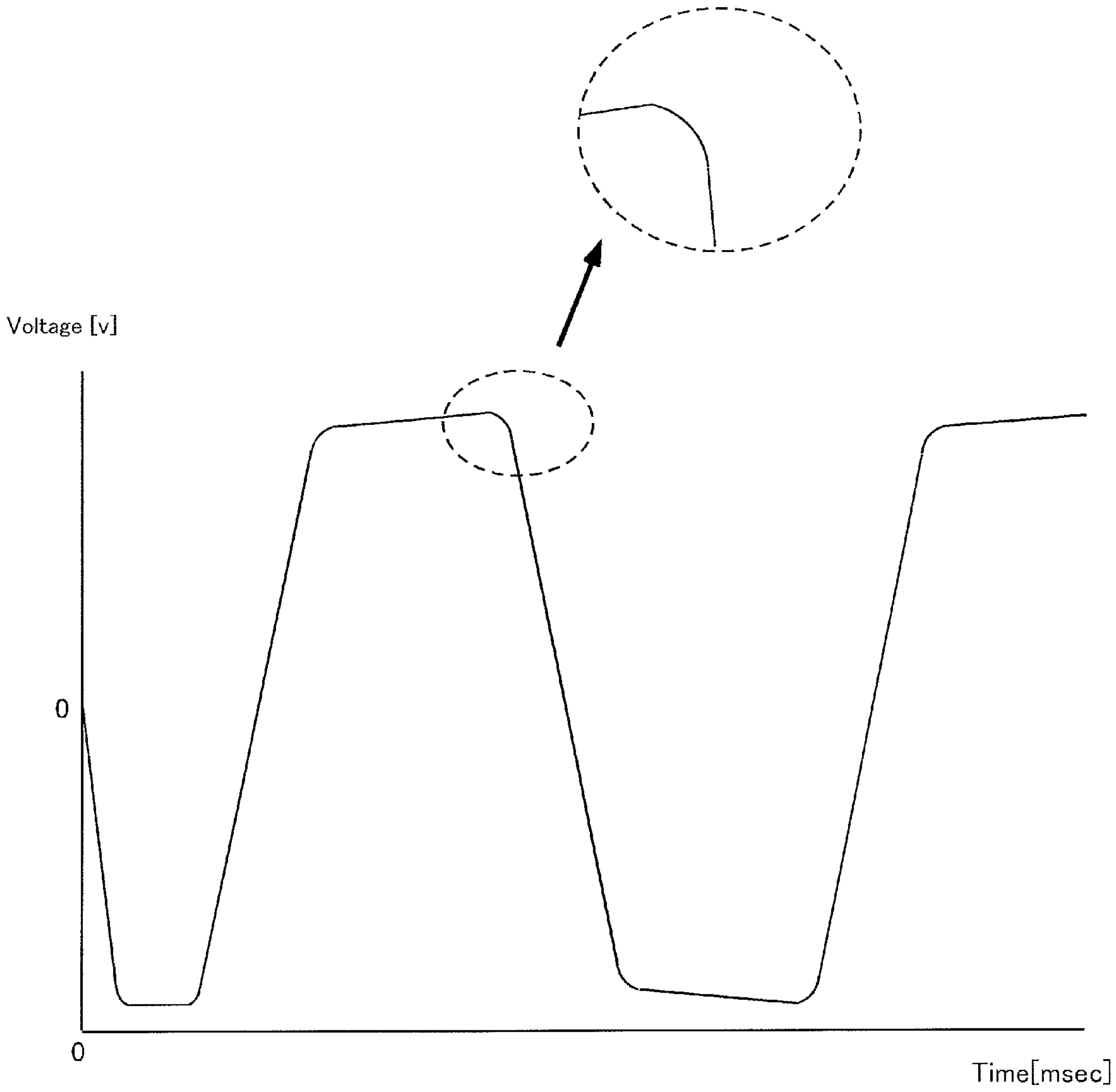
FIG. 2 is a graph illustrating music signal that the effect circuit outputs.

In the effect circuit 1, a positive side music signal is clipped by sum voltage of zener voltage (for example, 4.7 v) of the zener diode D1 and forward voltage (for example, 0.6 v) of the diode D4. A negative side music signal is clipped by sum voltage of zener voltage (for example, 4.7 v) of the zener diode D2 and forward voltage (for example, 0.6 v) of the diode D3. FIG. 2 is a graph illustrating the music signal that the effect circuit 1 outputs. A vertical axis illustrates voltage [v] and a horizontal axis illustrates time [ms]. As illustrated in FIG. 2, a steep edge of clip waveform by the zener diodes D1 and D2 is rounded.

Second Embodiment

Figure 3:
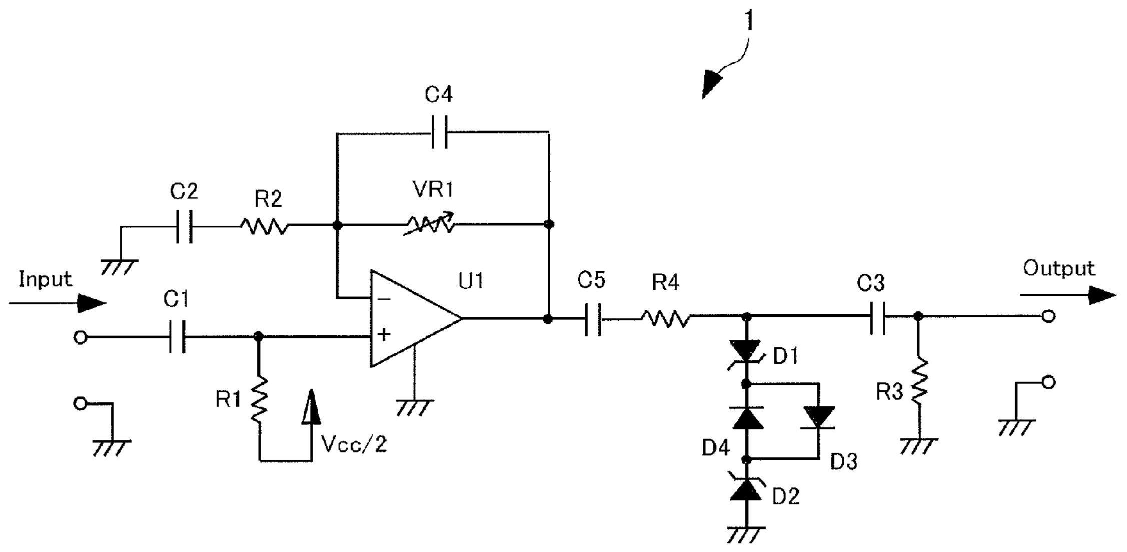
FIG. 3 is a diagram illustrating a circuit configuration of an effect circuit according to a second embodiment of the present invention.
Figure 11:
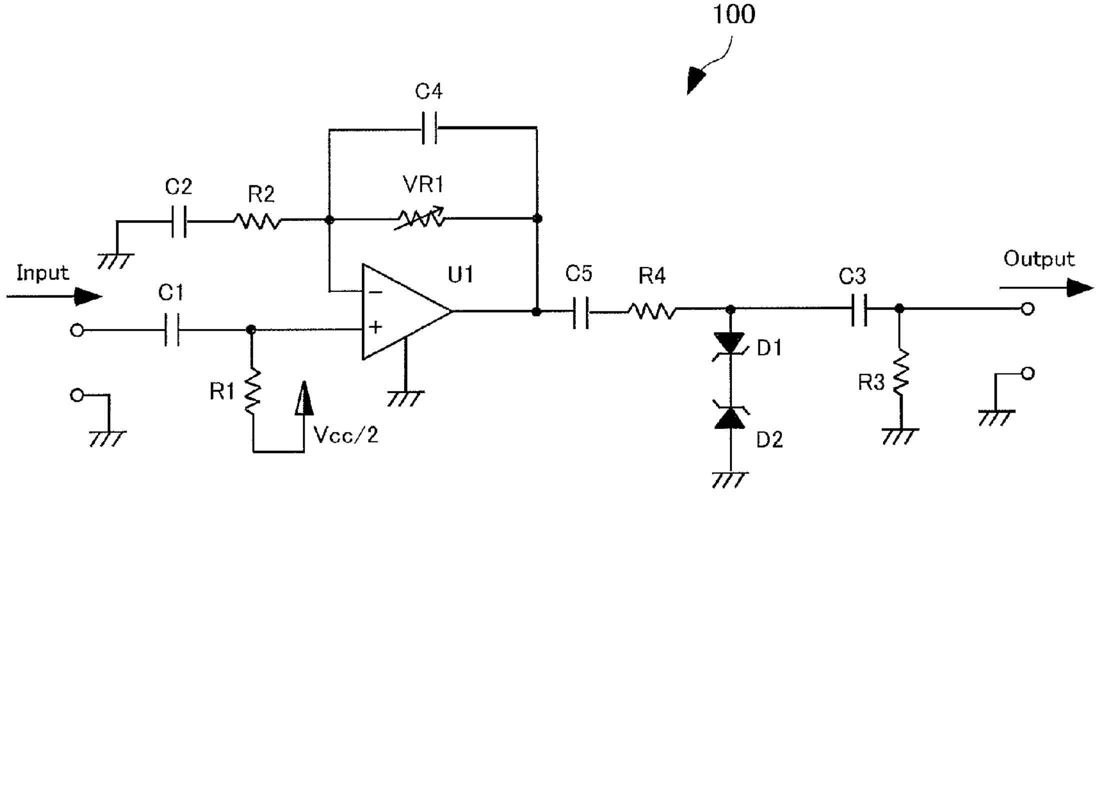
FIG. 11 is a diagram illustrating a circuit configuration of another conventional effect circuit.

FIG. 3 is a diagram illustrating a circuit configuration of an effect circuit according to a second embodiment. The effect circuit 1 illustrated in FIG. 3 is compared with another conventional circuit 100 illustrated in FIG. 11 and a configuration to which the diodes D3 and D4 are added is different. In the effect circuit 1 illustrated in FIG. 3, the positive side music signal that is output from the operational amplifier U1 is clipped by the sum voltage of the zener voltage of the zener diode D1 and the forward voltage of the diode D4. The negative side music signal that is output from the operational amplifier U1 is clipped by the sum voltage of the zener voltage of the zener diode D2 and the forward voltage of the diode D3.

As described above, in the first and the second embodiments, the diodes D3 and D4 are connected in parallel so that each cathode and anode are connected and are provided between the cathodes of the zener diodes D1 and D2. Therefore, voltage to clip the music signal becomes voltage adding the zener voltage of the zener diode D1 and the forward voltage of the diode D4 and voltage adding the zener voltage of the zener diode D2 and the forward voltage of the diode D3. Namely, since the voltage to clip the music signal is risen by the forward voltage of the diode, the steep edge of clip waveform by the zener diodes D1 and D2 becomes round, abrasive sound is relieved, and an odd-harmonic component is reduced. Thus, the music signal becomes a music signal to which round-shaped distortion effect is given. Therefore, according to the first and the second embodiments, the round-shaped distortion effect can be given to the music signal.

Further, in the first and the second embodiments, amplitude of the music signal that is output from the effect circuit 1 becomes big compared with the conventional effect circuit 100. Therefore, according to the first and the second embodiments, the music signal that has big amplitude and to which the distortion effect is given can be obtained in a simple circuit configuration that only the diodes D3 and D4 are added to the conventional effect circuit 100.

Further, in the first and the second embodiments, the number of the diodes D3 and D4 that are in parallel is the same (one). Thus, the positive side music signal and the negative side music signal are clipped symmetrically. Therefore, in the first and the second embodiments, the effect circuit 1 can be a distortion circuit that gives the distortion effect by clipping the music signal symmetrically.

Third Embodiment

Figure 4:
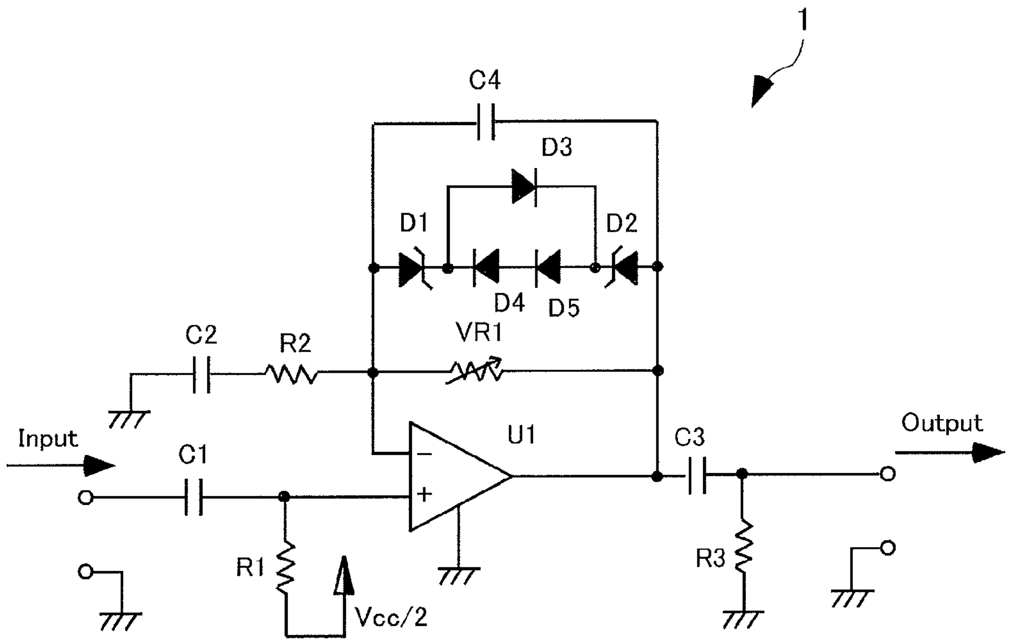
FIG. 4 is a diagram illustrating a circuit configuration of an effect circuit according to a third embodiment of the present invention.

FIG. 4 is a diagram illustrating a circuit configuration of an effect circuit of a third embodiment. The effect circuit 1 according to the third embodiment is compared with the effect circuit 1 illustrated in FIG. 1 and a configuration to which a diode D5 is added is different. The diode D5 is connected to the diode D4 in series. An anode of the diode D4 and a cathode of the diode D5 are connected. The diode D5 is a silicon diode. In the effect circuit 1 illustrated in FIG. 4, the positive side music signal is clipped by sum voltage of the zener voltage of the zener diode D1 and forward voltage of the diodes D4 and D5. The negative side music signal is clipped by the sum voltage of the zener voltage of the zener diode D2 and the forward voltage of the diode D3.

Fourth Embodiment

Figure 5:
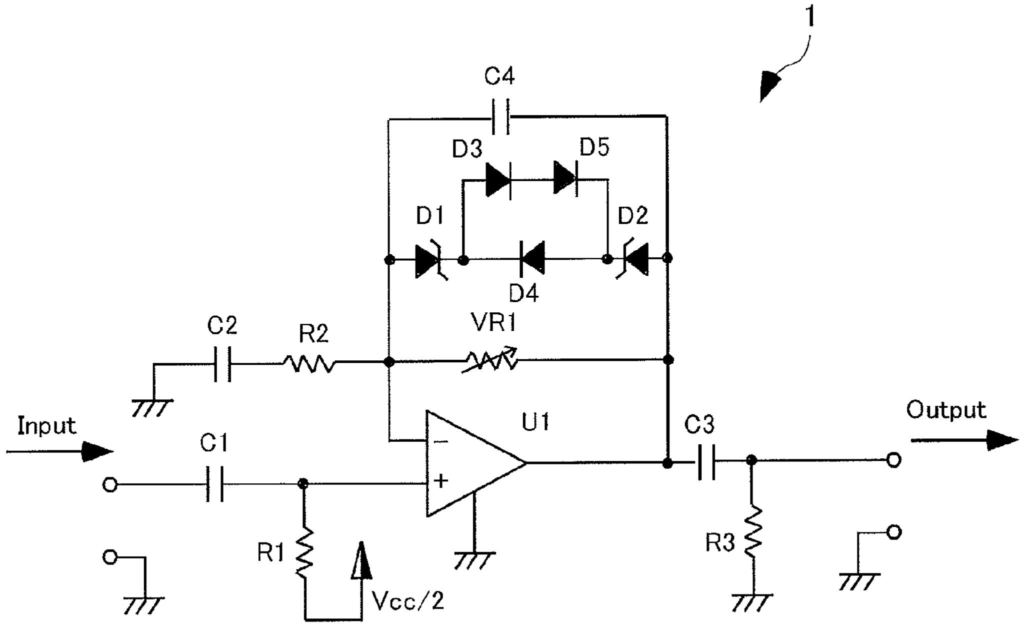
FIG. 5 is a diagram illustrating a circuit configuration of an effect circuit according to a fourth embodiment of the present invention.

FIG. 5 is a diagram illustrating a circuit configuration of an effect circuit of a fourth embodiment. The effect circuit 1 according to the fourth embodiment is compared with the effect circuit 1 illustrated in FIG. 1 and a configuration to which the diode D5 is added is different. The diode D5 is connected to the diode D3 in series. A cathode of the diode D3 and an anode of the diode D5 are connected. The diode D5 is a silicon diode. In the effect circuit 1 illustrated in FIG. 5, the positive side music signal is clipped by the sum voltage of the zener voltage of the zener diode D1 and the forward voltage of the diode D4. The negative side music signal is clipped by sum voltage of the zener voltage of the zener diode D2 and the forward voltage of the diodes D3 and D5.

Fifth Embodiment

Figure 6:
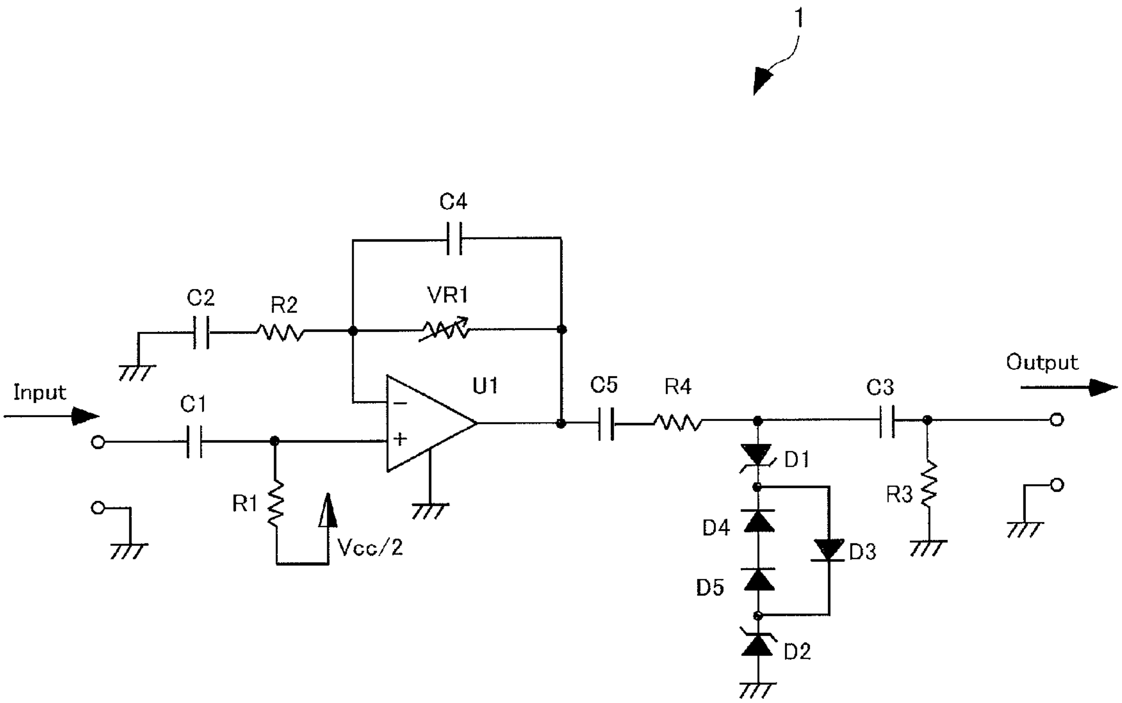
FIG. 6 is a diagram illustrating a circuit configuration of an effect circuit according to a fifth embodiment of the present invention.

FIG. 6 is a diagram illustrating a circuit configuration of an effect circuit of a fifth embodiment. The effect circuit 1 according to the fifth embodiment is compared with the effect circuit 1 illustrated in FIG. 3 and a configuration that the diode D5 is added is different. The diode D5 is connected to the diode D4 in series. The anode of the diode D4 and the cathode of the diode D5 are connected. The diode D5 is a silicon diode. In the effect circuit 1 illustrated in FIG. 6, the positive side music signal that is output from the operational amplifier U1 is clipped by the sum voltage of the zener voltage of the zener diode D1 and the forward voltage of the diodes D4 and D5. The negative side music signal that is output from the operational amplifier U1 is clipped by the sum voltage of the zener voltage of the zener diode D2 and the forward voltage of the diode D3.

Sixth Embodiment

Figure 7:
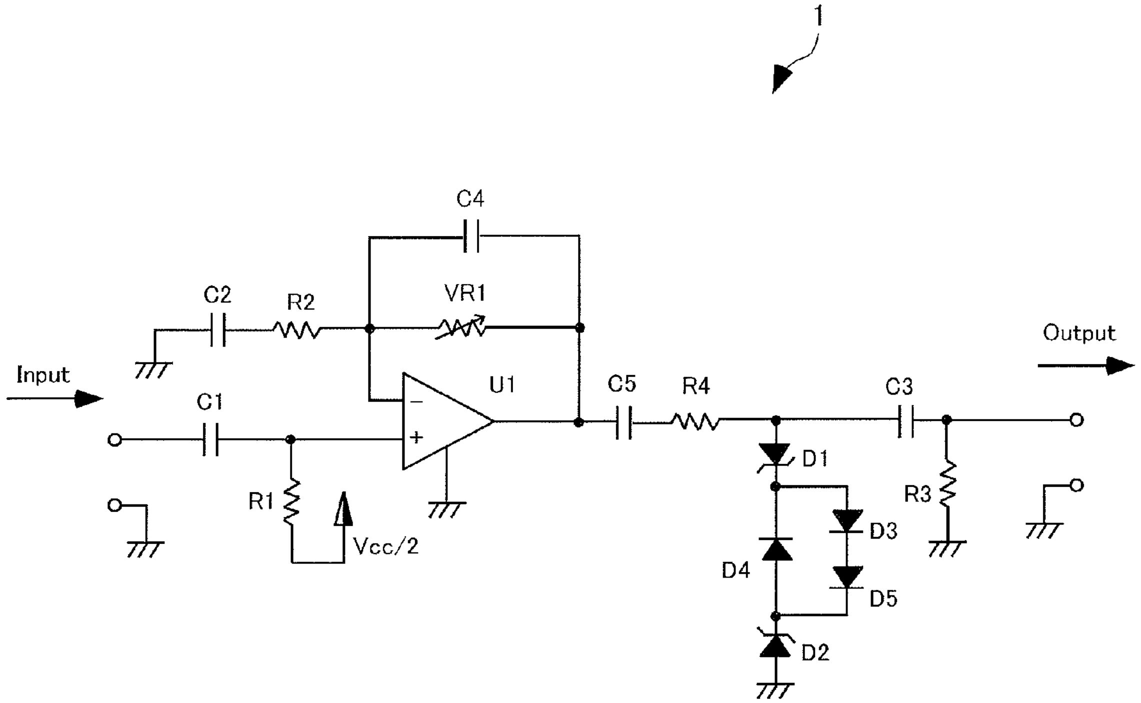
FIG. 7 is a diagram illustrating a circuit configuration of an effect circuit according to a sixth embodiment of the present invention.

FIG. 7 is a diagram illustrating a circuit configuration of an effect circuit of a sixth embodiment. The effect circuit 1 according to the sixth embodiment is compared with the effect circuit 1 illustrated in FIG. 3 and a configuration to which the diode D5 is added is different. The diode D5 is connected to the diode D3 in series. The cathode of the diode D3 and the anode of the diode D5 are connected. The diode D5 is a silicon diode. In the effect circuit 1 illustrated in FIG. 7, the positive side music signal that is output from the operational amplifier U1 is clipped by the sum voltage of the zener voltage of the zener diode D1 and the forward voltage of the diodes D4. The negative side music signal that is output from the operational amplifier U1 is clipped by the sum voltage of the zener voltage of the zener diode D2 and the forward voltage of the diodes D3 and D5.

As described above, in the third to the sixth embodiments, in the diodes D3 to D5, two diodes in each of which anode and cathode are connected in series and one diode are connected in parallel, and the number of the diodes that are in parallel is different. Thus, the positive side music signal and the negative side music are clipped asymmetrically. Therefore, in the third to the sixth embodiments, the effect circuit 1 can be an over drive circuit that gives the distortion effect to the music signal by clipping the music signal asymmetrically.

Seventh Embodiment

Figure 8:
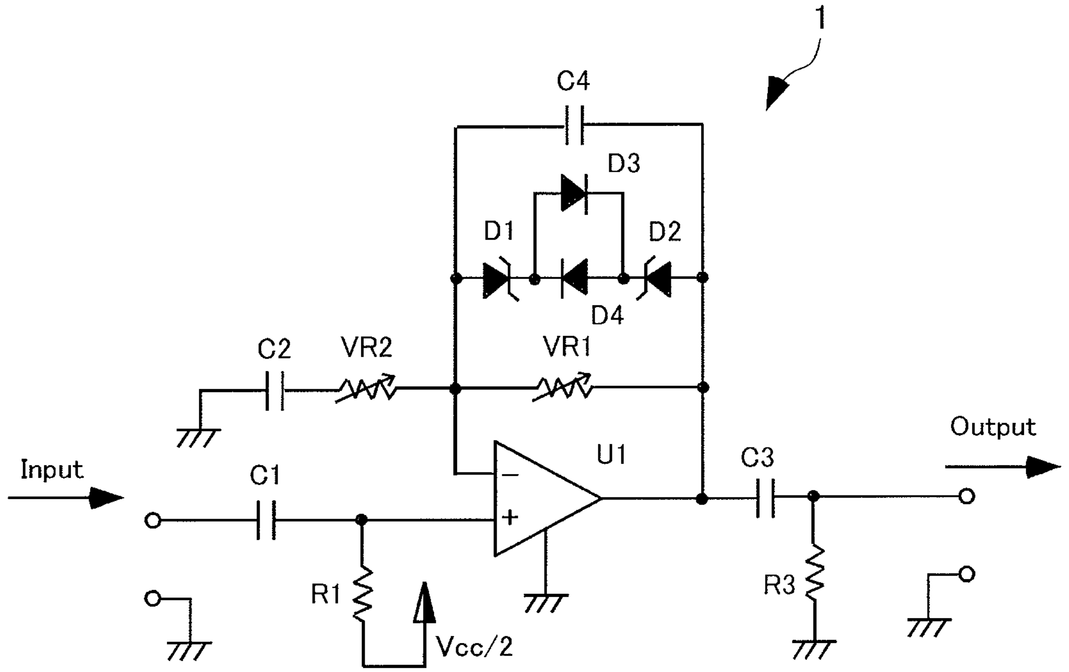
FIG. 8 is a diagram illustrating a circuit configuration of an effect circuit according to a seventh embodiment of the present invention.

FIG. 8 is a diagram illustrating a circuit configuration of an effect circuit according to a seventh embodiment. The effect circuit 1 according to the seventh embodiment is compared with the effect circuit 1 illustrated in FIG. 1 and a configuration that a variable resistor VR2 is used instead of the resistor R2 is different. In the seventh embodiment, since the input resistor of the operational amplifier U1 is the variable resistor VR2, the amplification factor of the operational amplifier U1 can be variable.

In the first to the seventh embodiments, since the feedback resistor of the operation amplifier U1 is the variable resistor VR1, the amplification factor of the operational amplifier U1 can be variable.

Although the embodiments of the present invention are described above, the applicable mode of the present invention is not limited to the above embodiments. As described below, various changes can properly be made without departing from the scope of the present invention.

In the above embodiments, each of the diodes D3 to D5 is a silicon diode. Not limited to this, each of the diodes D3 to D5 may be a germanium diode, for example.

In the above third to sixth embodiments, in the diodes D3 to D5, two diodes in each of which diode and cathode are connected in series and one diode are connected in parallel, and the number of the diodes that are in parallel is different. Not limited to this, when the effect circuit 1 is the over drive circuit, the diodes may include two or more diodes that are connected in series and the number of the diodes that are in parallel may be different.

The present invention can be suitably employed in an effect circuit that gives the effect such as the distortion to a music signal that is input from an electric musical instrument such as an electric guitar or an electric bass, an electronic musical instrument such as a keyboard, or a toy.

What is claimed is:

1. An effect circuit comprising:

an operational amplifier including a positive input terminal, a negative input terminal, and an output terminal, wherein a music signal is input to the positive input terminal while the music signal that is output from the output terminal is returned to the negative input terminal;

an input resistor connected to the negative input terminal;

a feedback resistor provided between the negative input terminal and the output terminal;

zener diodes, cathodes of which are connected, provided in parallel with the feedback resistor; and diodes connected in parallel so that each cathode and each anode are connected, and provided between the cathodes of the zener diodes.

2. An effect circuit comprising:

an operational amplifier including a positive input terminal, a negative input terminal, and an output terminal, wherein a music signal is input to the positive input terminal while the music signal that is output from the output terminal is returned to the negative input terminal;

an input resistor connected to the negative input terminal;

a feedback resistor provided between the negative input terminal and the output terminal;

zener diodes, cathodes of which are connected, provided in parallel with the output terminal; and diodes connected in parallel so that each cathode and each anode are connected, and provided between the cathodes of the zener diodes.

3. The effect circuit according to claim 1, wherein the diodes include two or more diodes in each of which anode and cathode are connected in series and the number of the diodes that are in parallel is different.

4. The effect circuit according to claim 1, wherein the number of the diodes that are in parallel is the same.

5. The effect circuit according to claim 1, wherein the input resistor is a variable resistor.

6. The effect circuit according to claim 1, wherein the feedback resistor is a variable resistor.

7. The effect circuit according to claim 1, wherein each of the diodes is a silicon diode.

* * * * *